United States Patent
Allen et al.

(10) Patent No.: US 10,978,508 B2
(45) Date of Patent: Apr. 13, 2021

(54) INFRARED DETECTOR HAVING A DIRECTLY BONDED SILICON SUBSTRATE PRESENT ON TOP THEREOF

(71) Applicant: L3 Cincinnati Electronics Corporation, Mason, OH (US)

(72) Inventors: Steven Allen, Maineville, OH (US); Michael Garter, Lebanon, OH (US); Robert Jones, Cincinnati, OH (US); Joseph Meiners, Cincinnati, OH (US); Yajun Wei, Saratoga, CA (US); Darrel Endres, West Chester, OH (US)

(73) Assignee: L3 CINCINNATI ELECTRONICS CORPORATION, Mason, OH (US)

( * ) Notice: Subject to any disclaimer, the term of this patent is extended or adjusted under 35 U.S.C. 154(b) by 0 days.

(21) Appl. No.: 16/654,782

(22) Filed: Oct. 16, 2019

(65) Prior Publication Data
US 2020/0119063 A1    Apr. 16, 2020

Related U.S. Application Data

(60) Provisional application No. 62/746,394, filed on Oct. 16, 2018.

(51) Int. Cl.
*H01L 27/146*    (2006.01)
*H01L 23/00*    (2006.01)

(52) U.S. Cl.
CPC .......... *H01L 27/1469* (2013.01); *H01L 24/08* (2013.01); *H01L 24/80* (2013.01); *H01L 27/1462* (2013.01); *H01L 27/1465* (2013.01); *H01L 27/14634* (2013.01); *H01L 27/14652* (2013.01); *H01L 27/14685* (2013.01); *H01L 27/14687* (2013.01); *H01L 27/14694* (2013.01); *H01L 27/14696* (2013.01); *H01L 2224/08145* (2013.01); *H01L 2224/80013* (2013.01); *H01L 2224/80894* (2013.01)

(58) Field of Classification Search
CPC ... H01L 24/80; H01L 27/14649–14652; H01L 27/14669–1467; H01L 27/14687; H01L 2224/80894–80896
See application file for complete search history.

(56) References Cited

U.S. PATENT DOCUMENTS

| | | | |
|---|---|---|---|
| 4,983,251 A | 1/1991 | Haisma et al. |
| 6,191,006 B1 | 2/2001 | Mori |
| 7,079,307 B2 | 7/2006 | Chun Liu et al. |
| 7,592,593 B2 | 9/2009 | Kauffman et al. |
| 7,608,830 B1 | 10/2009 | Kinch |
| 7,800,067 B1 | 9/2010 | Rajavel et al. |
| 8,110,823 B2 | 2/2012 | Bowers |

(Continued)

*Primary Examiner* — Daniel P Shook
(74) *Attorney, Agent, or Firm* — Dinsmore & Shohl LLP

(57) ABSTRACT

A direct bonding method for infrared focal plane arrays, includes steps of depositing a thin adhesion layer on infrared radiation detecting material, removing a portion of the thin adhesion layer with a chemical-mechanical polishing process, forming a bonding layer at a bonding interface, and bonding the infrared radiation detecting material to a silicon wafer with the thin adhesion layer as a bonding layer. The thin adhesion layer may include $SiO_x$, where x ranges between 1.0 and 2.0. The thickness of the thin adhesion layer to form the bonding layer is 500 angstrom or less.

13 Claims, 9 Drawing Sheets

(56) References Cited

U.S. PATENT DOCUMENTS

| | | |
|---|---|---|
| 8,202,785 B2 | 6/2012 | Castex et al. |
| 8,305,686 B2 | 11/2012 | Arai et al. |
| 8,608,894 B2 | 12/2013 | Black et al. |
| 8,846,432 B2 | 9/2014 | Jones et al. |
| 9,018,077 B2 | 4/2015 | Herbots et al. |
| 9,318,527 B2 | 4/2016 | Huet et al. |
| 9,431,368 B2 | 8/2016 | Enquist et al. |
| 9,831,273 B2 | 11/2017 | Ryou |
| 9,922,954 B2 | 3/2018 | Moriceau et al. |
| 2015/0102447 A1* | 4/2015 | Huet ................. H01L 24/03 257/433 |

* cited by examiner

INFRARED DETECTOR HAVING A DIRECTLY BONDED SILICON SUBSTRATE PRESENT ON TOP THEREOF

RELATED APPLICATION

This application is a non-provisional application which claims priority to Provisional Application No. 62/746,394 filed Oct. 16, 2018 and entitled, "Wafer Fusion Bonding Methods For Infrared Focal Plane Arrays," the disclosure of which is incorporated herein by reference in its entirety.

TECHNICAL FIELD

Embodiments described herein generally relate to infrared detectors having a directly bonded silicon substrate present on top thereof and more specifically, to a frontside-illuminated infrared detector having a directly bonded silicon substrate without an epoxy as an adhesive layer. Embodiments further relate to a direct bonding process for bonding contact surfaces of infrared detectors and silicon wafers using oxidation of the contact surfaces.

BACKGROUND

An infrared sensing system is an imaging system that detects photons in the infrared spectrum. Infrared focal plane arrays (FPAs) are widely used in imaging systems. An FPA includes an array of photodetector pixels capable of detecting photons in the infrared spectrum. A material that is sensitive to infrared radiation, such as indium antimonide (InSb), gallium arsenide and indium gallium arsenide, or other infrared-sensitive materials, may be used for fabricating an infrared detector wafer.

Conventionally, infrared detector arrays have been manufactured by being grown and patterned directly on an epitaxial substrate. Then, infrared detector arrays are connected to a readout integrated circuit via indium bonding bumps. Subsequently, additional processes for removing the epitaxial substrate are needed. As a result, a thin infrared absorbing material (i.e., the infrared detector) connected to a silicon integrated circuit has been fabricated. However, the finished infrared detector device is not bonded to a silicon wafer and does not have a structure having a silicon substrate present on top of the infrared detector.

Many of conventionally available infrared detectors are backside-illuminated detectors. The backside-illuminated detectors have the top surface where detector materials are grown and an interconnect structure is arranged on the top surface. There are frontside-illuminated infrared detectors that invert the structure of the backside-illuminated detectors. On the top surface of the frontside-illuminated infrared detectors, a silicon substrate is present. In the frontside-illuminated infrared detectors, infrared radiation enters through the front side rather than the back side. Due to the structure, the frontside-illuminated infrared detectors may provide manufacturing advantages. For example, the frontside-illuminated infrared detectors may enable more processing at the wafer level.

Conventional wafer bonding methods have been available to bond IR detector materials to an optical silicon wafer. Conventional wafer bonding methods use epoxies as an adhesive layer at the bonding interface. In other words, conventional wafer bonding methods do not directly bond the infrared detector materials to the silicon wafer.

Generally, epoxies are by nature organic polymer materials and thus absorb infrared (IR) radiation to a significant degree in the IR spectral regions of interest. More specifically, epoxy absorbs infrared radiation in a long-wave infrared (LWIR) band and reduces infrared transmission across a bonding interface, as shown in FIG. 1. FIG. 1 also shows that the mid-wave infrared (MWIR) band affected by use of epoxies. The optical interference by epoxies in the LWIR and MWIR bands may impact the overall performance of infrared detector devices, which need to have excellent sensitivity in those infrared bands.

Epoxies also have relatively lower refractive index functions than IR detector materials and silicon wafers. Many detector materials, such as InSb and SLS wafers, have high refractive index values (3.6~4.0), and they are closely matched to the refractive index for silicon (3.5). Thus, the conventional bonding process using epoxy requires anti-reflective coatings to be used at the wafer bonding interface to optimize IR radiation transmission into the detector materials. Accordingly, there is a need to provide improved bonding processes for directly bonding IR detector materials such as InSb and SLS wafers to silicon wafers without using epoxy such that optical interference from epoxy may be eliminated. There is also a need to provide direct bonding processes for bonding IR detector materials to silicon wafers without requiring anti-reflective coatings at the bonding interface, which may reduce manufacturing cost and simplify manufacturing processes of infrared detector devices.

SUMMARY

In some embodiments, a direct bonding method for infrared focal plane arrays, includes steps of depositing a thin adhesion layer on infrared radiation detecting material, removing a portion of the thin adhesion layer with a chemical-mechanical polishing process, forming a bonding layer at a bonding interface, and bonding the infrared radiation detecting material to a silicon wafer with the thin adhesion layer as the bonding layer.

In some embodiments, the step of depositing the portion of the thin adhesion layer further comprises depositing the thin adhesion layer such that a thickness of the thin IR transparent adhesion layer is 1000 angstroms or less. The step of removing the portion of the thin adhesion layer further comprises removing the portion of the thin adhesion layer such that a thickness of the thin adhesion layer is 500 angstroms or less.

In some embodiments, the step of depositing the thin adhesion layer further comprises forming the thin adhesion layer from infrared transparent materials. The step of depositing the thin adhesion layer further comprises forming the thin adhesion layer with silicon monoxide material.

In some embodiments, the step of forming the thin adhesion layer with $SiO_x$, where x is in the range of 1.0~2.0. The step of forming the bonding layer comprises forming no epoxy layer at the bonding interface. Additionally, the step of forming the bonding layer comprises forming no anti-reflective coating layer at the bonding interface.

In some embodiments, a direct bonding method for infrared detector wafers includes steps of polishing a first surface of an infrared detector wafer with a chemical-mechanical polishing (CMP) process to atomically smoothen the first surface, depositing a thin $SiO_x$ layer on the first surface, where x ranges 1.0 to 2.0, polishing a second surface of the thin $SiO_x$ layer to atomically smoothen the second surface and to have a predetermined thickness, polishing a third surface of a silicon wafer with the CMP process to atomically smoothen the third surface, and directly bonding the second surface of the infrared detector wafer to the third surface the silicon wafer.

In some embodiments, an infrared detector wafer having a directly bonded semiconductor wafer on top thereof, includes a silicon wafer having a first bonding surface, an infrared detector wafer comprising a thin adhesion layer and having a second bonding surface formed on top of the thin adhesion layer, and a bonding interface formed by directly bonding the first bonding surface and the second bonding surface. The thin adhesion layer includes a $SiO_x$ layer on the first surface, where x ranges 1.0 to 2.0. The thickness of the $SiO_x$ layer is 500 angstroms or less. The bonding interface includes no epoxy layer as an adhesive layer. The bonding interface includes no anti-reflective layer.

In some embodiments, the infrared detector wafer includes a dual-band pixel that includes a first infrared band absorbing layer and a second infrared band absorbing layer. In other embodiments, the infrared detector wafer includes a single-band pixel that includes a single infrared band absorbing layer.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 3A depicts an infrared image of a good bond between two silicon wafers (no bond voids), and FIG. 3B depicts a poor bond between two silicon wafers (bond voids are visible as dark areas in image);

DETAILED DESCRIPTION OF EMBODIMENTS

Infrared detector wafers are used to form and implement infrared detecting devices such as infrared focal plane arrays (FPAs). Silicon wafers may be used to be bonded to the infrared detector wafers for various purposes. For embodiments described herein, infrared detector wafers are referred to as wafers that include infrared radiation detecting materials. For the purpose of describing direct bonding between infrared detector wafers and silicon wafers, infrared detector wafers including infrared absorption materials are explained and detailed explanations as to the overall structures of infrared detecting devices may be omitted. In the embodiments described herein, infrared detector materials correspond to infrared detector wafer. Infrared detector materials primarily include infrared absorption materials such as one or more infrared absorber layers.

Figure 1:
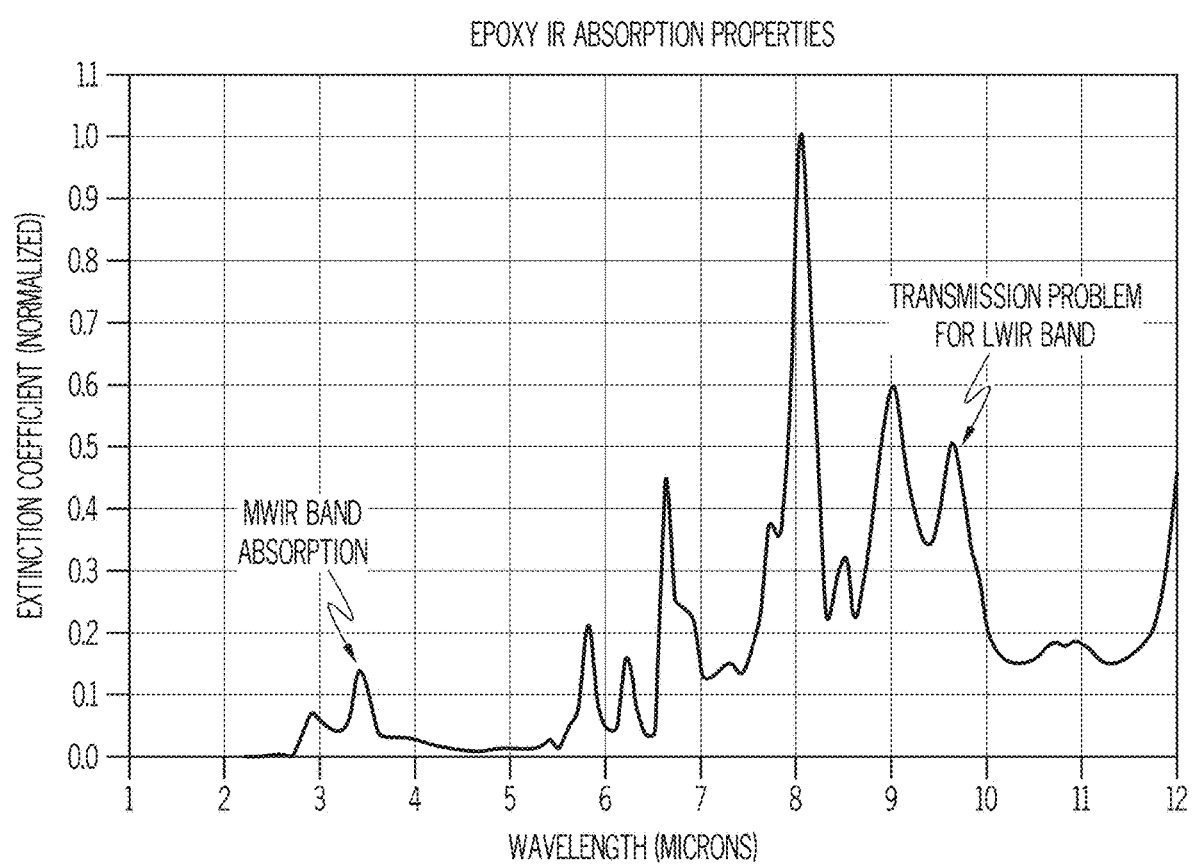
FIG. 1 depicts epoxy absorption properties in the related art.
Figure 2:
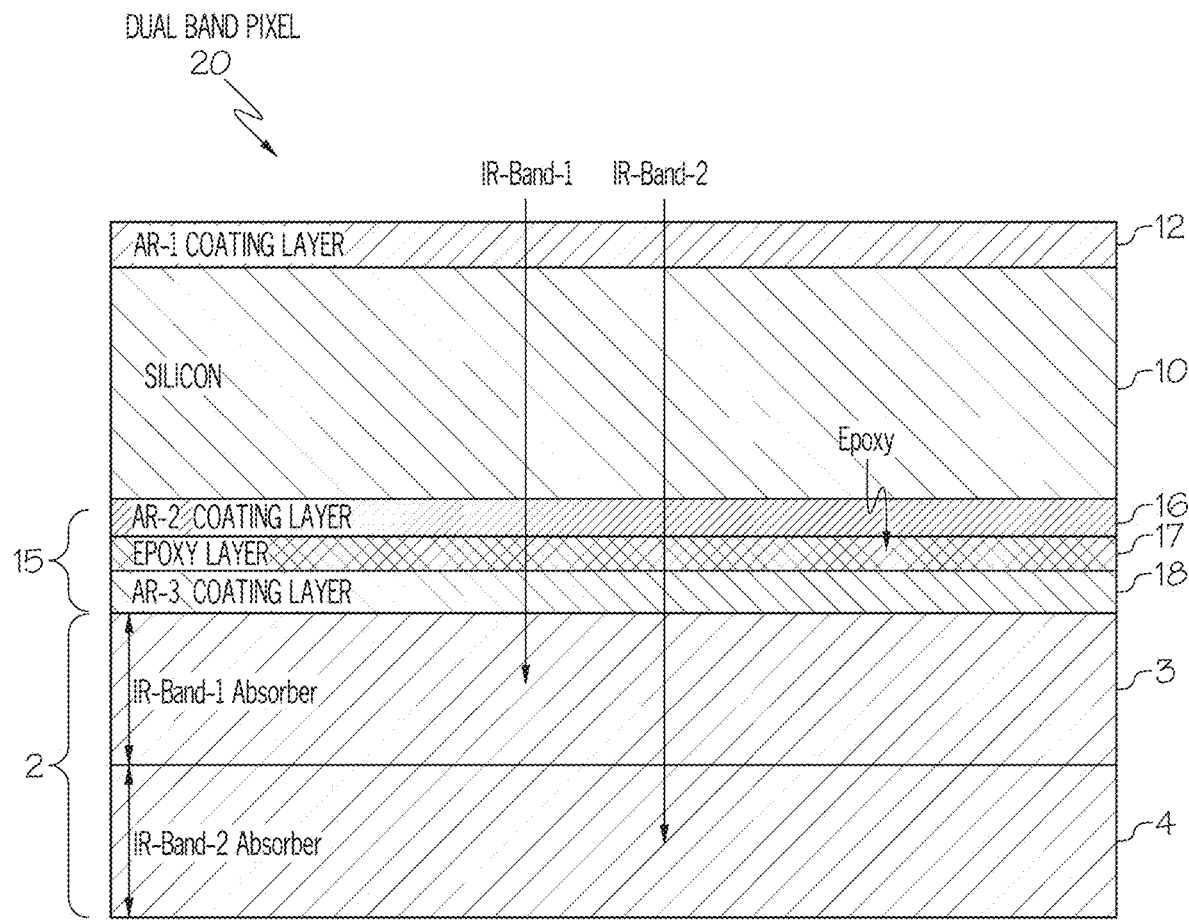
FIG. 2 depicts a cross section view of a dual band pixel using conventional wafer bonding processes with epoxy in the related art.

FIG. 2 illustrates one example structure of a conventional infrared FPA, in particular, a frontside-illuminated barrier type infrared FPA. FIG. 2 shows a cross-section view of a dual band pixel 20 of the infrared FPA. The dual band pixel 20 includes a silicon substrate 10 and infrared detector materials 2 including an infrared band-1 absorber 3 and an infrared band-2 absorber 4. The silicon substrate 10 corresponds to an optical silicon wafer (not shown) and the infrared detector materials 2 correspond to an infrared detector wafer (not shown). The optical silicon wafer and the infrared detector wafer are bonded at a bonding interface 15. FIG. 2 shows that the infrared detector materials 2 primarily includes absorption materials.

At the bonding interface 15, an epoxy layer 17 is interposed between two anti-reflective coating layers 16, 18 as an adhesive layer. Two anti-reflective coating layers 16, 18 are present to avoid or reduce reflection of infrared radiation that enters the silicon substrate 10, passes the bonding interface 15 and reaches the absorbers 3, 4. FIG. 2 also shows an anti-reflective coating layer 12 at an opposite side of the bonding interface 15, i.e., on the top surface of the silicon substrate 10. As indicated in FIG. 2, infrared radiation enters the dual band pixel 20 through the top surface of the silicon substrate 10 and the anti-reflective coating layer 12 is present to prevent or reduce reflection of the infrared radiation.

In FIG. 2, the infrared FPA includes the dual-band pixel 20 which has the infrared (IR) band-1 absorber layer 3 and the IR band-2 absorber layer 4. As shown in FIG. 2, IR Band-1 is absorbed in the IR Band-1 absorber layer 3 and IR Band-2 is absorbed in the IR Band-2 absorber layer 4.

As shown in FIG. 2, the silicon substrate 10 is bonded to the infrared detector layer 2 by using the conventional wafer bonding methods. The infrared detector layer 2 includes infrared (IR) detector materials from indium antimonide (InSb) or Strained Layer Superlattice (SLS) wafers and is bonded to the optical silicon wafer.

Infrared detector wafers are formed of infrared (IR) detector materials which include indium antimonide (InSb) or Strained Layer Superlattice (SLS) wafers. Alternatively, or additionally, infrared detector wafers further include HgCdTe, InAsSB, or AlGaAs/GaAs (QWIP) but infrared detector wafers are not limited thereto. In embodiments described herein, IR detector materials are directly bonded to optical silicon wafers. In other words, no epoxy layer may be used as an adhesive layer at a bonding interface. As discussed above in connection with FIG. 2, epoxies may absorb infrared radiation in a band that is important to infrared detectors and degrade overall performance of infrared detectors. Moreover, using an epoxy layer as an adhesive layer may result in requiring additional layers, such as anti-reflective layers. Such additional layers may incur additional fabricating cost and processes and impact transmission properties of infrared radiation.

In the embodiments described herein, a wafer bonding method or process directly bonds an infrared wafer to a silicon wafer without using epoxy as an adhesive layer. Instead of the epoxy layer, the embodiments described herein use a silicon monoxide ($SiO_x$) layer as an adhesive layer. In some embodiments, x ranges between 1.0 and 2.0. The thickness of the silicon monoxide layer may be 1000 angstroms or less upon deposition. Preferably, the thickness of the silicon monoxide layer may be 500 angstrom or less by polishing the silicon monoxide layer. In other embodiments, the thickness of the silicon monoxide layer may vary depending on a need. In the embodiments described herein, the silicon monoxide layer is described as an adhesive layer for the direct wafers bonding process, but the embodiments may not be limited thereto.

In the embodiments described herein, there may be no anti-reflective coating layer arranged at a bonding interface. In other words, when the silicon monoxide layer is arranged as a bonding adhesive layer, an additional anti-reflective coating layer may not be needed. The silicon monoxide layer may be transparent as to infrared radiation. Before and after depositing the silicon monoxide layer, it is important that the infrared wafers are polished and cleaned in order to be ready for the direct bonding process.

In the embodiments described herein, infrared detector wafers may implement a single-band infrared detector, or a dual-band infrared detector. For the dual-band infrared detector, two absorbing layers are provided such that infrared radiation in different bands can be detected.

In the embodiments described herein, the direct bonding process requires extremely clean and smooth wafer surfaces of the infrared detector wafer and the optical silicon wafer so that covalent chemical bonds can be formed between atoms on each side of the wafer interface, bonding the wafers together directly, without the use of epoxy to bond the wafers together. The surfaces of the wafers should be polished to meet the level of atomically smooth surfaces. For instance, a chemical-mechanical polishing (CMP) process may be used for polishing the surfaces of the infrared detector wafers and optical silicon wafers.

Plasma surface activation and thermal annealing may be utilized to activate the wafer surfaces and form the covalent chemical bonds, producing a high-strength permanent wafer bond. In some embodiments, plasma surface activation is performed with respect to both wafer surfaces and subsequently, both wafers are subject to a cleaning process. The infrared detector wafer and the silicon wafer may be pre-bonded and then an annealing process is performed to solidify the pre-bonding of the wafers and convert the pre-bonding to permanent bonding.

Figure 3A:
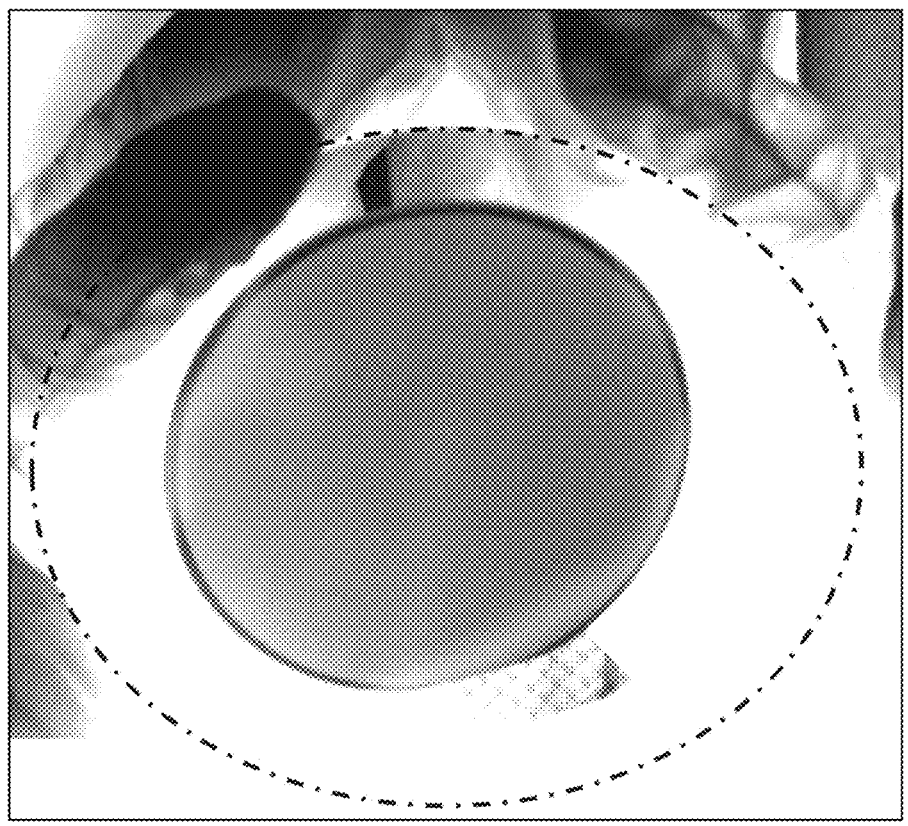
FIGS. 3A and 3B illustrate silicon (Si) to silicon (Si) bonding with no epoxy in the bond interface in the related art.
Figure 3B:
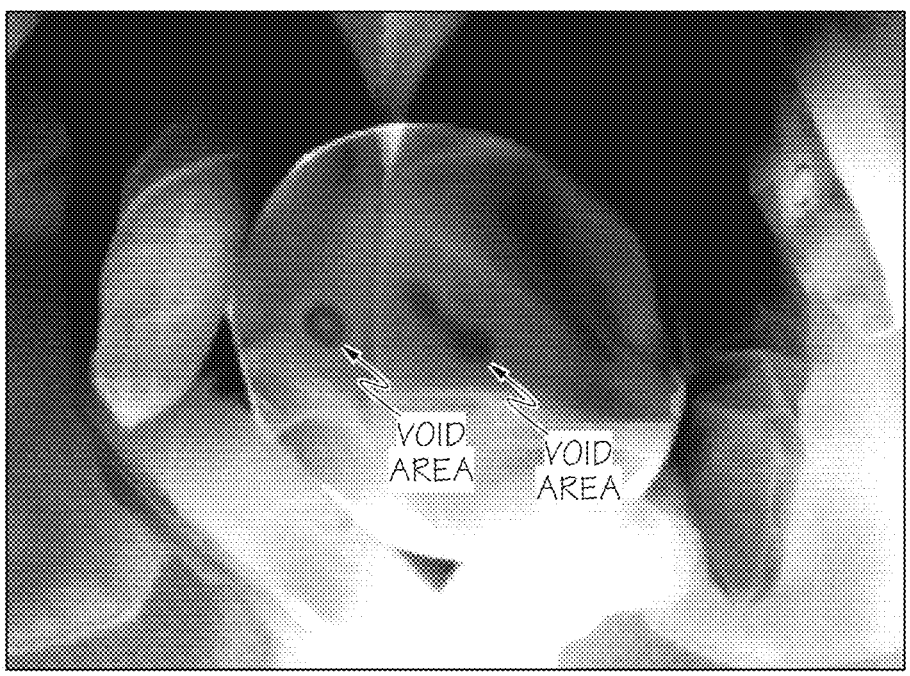

Embodiments described herein directly bond different wafers, such as infrared detector wafers to silicon wafers. The same type of wafers, such as silicon wafers, i.e., silicon wafer to silicon wafer, may have been bonded. FIGS. 3A and 3B illustrate the conventional silicon to silicon bonding in a bond interface. In particular, FIG. 3A depicts an infrared image of a good bond between two silicon wafers. As shown in FIG. 3A, no bond voids are found in the bond interface. FIG. 3B depicts a poor bond between two silicon wafers. As shown in FIG. 3B, bond voids may be visible as dark areas in image. FIG. 3B illustrates that a large defect, an unclean surface, etc. may result in apparent void areas.

The direct bonding between two different wafers, such as the infrared detector wafer and the optical silicon wafer, has not been available or performed. Such direct bonding between two different wafers, in particular, involving the infrared detector wafer, may present different considerations. IR detector wafers, such as InSb and SLS wafers, typically have patterning on the frontside bonding surface. This patterning results in a topography that is not smooth enough for wafer bonding. However, recent epitaxial designs, such as transparent contact designs for SLS wafers, do not require frontside patterns, making it possible to achieve a smoother surface on these materials. A polishing method, such as a chemical-mechanical polishing (CMP) process, may be used to smoothen out the bonding surfaces. The CMP process is a process which removes a small amount of material from the wafer surface, leaving a highly smooth surface. For instance, surface roughness less than 10 angstroms can be achieved with the CMP process. The silicon wafer may also require an additional CMP process to achieve the surface smoothness needed for the direct bonding. If the surface smoothness may not be achieved, the bonding interface may develop void areas as shown in FIG. 3B.

Figure 4:
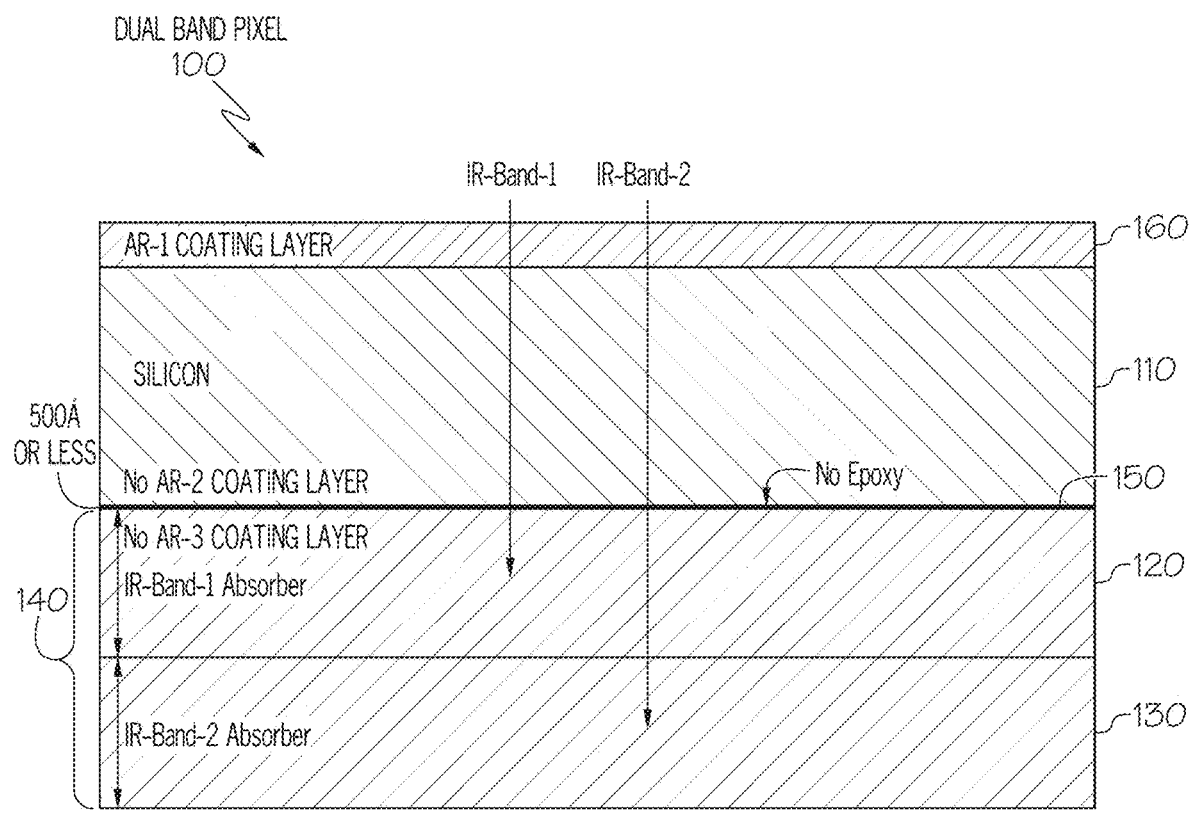
FIG. 4 depicts a cross sectional view of dual-band IR detector materials directly bonded to a silicon wafer according to embodiments described and illustrated herein.

Referring to FIG. 4, the direct bonding process between an infrared detector wafer and a silicon wafer is explained. FIG. 4 depicts one example embodiment of a dual band SLS pixel 100 fabricated using a wafers direct bonding method for a SLS wafer as the infrared detector wafer. FIG. 4 illustrates a cross sectional view of a transparent silicon substrate 110 in contact with the SLS wafer 140 for dual band without using epoxy. For convenience of explanation, the SLS wafer 140 for dual band is described here in connection with FIG. 4, but the infrared detector wafer may not be limited to the SLS wafer. As discussed above and shown in FIG. 4, eliminating epoxy also removes the need for anti-reflective coating layers AR-2 and AR-3 coatings at the bonding interface between infrared absorber layers 120, 130 and the transparent silicon wafer (shown in FIG. 2). Without epoxy, both SLS wafers and the silicon wafers have high refractive indices that are closely matched. As shown in FIG. 4, there are two infrared bands including IR Band-1 absorber layer 120 and IR Band-2 absorber layer 130. In other embodiments, a single infrared band, or multiple infrared bands are possible.

In some embodiments, the SLS wafer 140 includes IR absorber materials that may be composed of III-V semiconductor materials with a sufficiently wide bandgap in order to allow IR radiation in the spectral regions of interest to be transmitted into the active IR material. Examples of the III-V semiconductor materials include, but are not limited to, GaSb, a short-wave infrared (SWIR) SLS material, bulk InAsSb material, sputtered wide bandgap films, etc. In other embodiments, as non-limiting examples, the absorber layer may comprise an n-doped InAs/InAsSb SLS, InAs/Ga(x)In(1-x)Sb SLS, a digital alloy (e.g., InAsSb absorber with GaAs strain balancer), or bulk absorber (e.g., bulk InAsSb).

In the bonding for silicon wafer to silicon wafer described above in connection with FIGS. 3A and 3B, a silicon dioxide film, such as $SiO_2$, is used as an adhesive layer. The silicon dioxide film may be typically more than 1.0 micron thick, which is considered significantly thick in the pertinent field of the wafer bonding. This silicon dioxide film acts as an adhesive layer at the bonding interface between silicon wafers. However, $SiO_2$ may not be suitable as an adhesive layer for an infrared wafer. $SiO_2$ also has strong absorption properties of infrared radiation, i.e., a strong IR peak, in a particular wavelength band, which is not desirable to be used with infrared detectors. For IR FPAs, therefore, silicon dioxide layers may present a problem because they interfere with optical transmission. For instance, in the long wave infrared (LWIR) band, the silicon dioxide layer may absorb a large amount of infrared radiation, reducing IR transmission passing through the silicon wafer into the IR detector material formed in the IR detector wafer.

In the direct bonding involving the infrared wafer shown in FIG. 4, an adhesion film 150, which is thin enough to be transparent, replaces the $SiO_2$ layer. Such thin adhesion film 150 presents excellent IR transmission including minimized LWIR transmission losses. Improved IR transmission can be achieved across all infrared spectral regions. The adhesion film 150 must be thin enough to minimize optical absorption and interference effects. By way of example, the thickness of the adhesion film 150 may be typically less than 1000 angstroms. By way of another example, permanent wafer bonds have now been achieved between SLS and silicon wafers with the adhesion film 150 less than 500 angstroms thick as the bonding interface layer. Overall, the thickness suitable for the thin adhesion film 150 may be 1000 angstroms or less and preferably, 500 angstroms or less.

In some embodiments, the adhesion film 150 is $SiO_x$, where x is in the range of 1.0~2.0. As discussed above, the adhesion film 150 replaces the thick $SiO_2$ film or layer which was used as an adhesion layer in the conventional art. The adhesion film 150 may not be limited to $SiO_x$ and other suitable materials available in the pertinent art may be used as the adhesion film with the thickness described above.

As shown in FIG. 4, the dual band SLS pixel may include a single AR coating layer 160 on the top side of optical silicon wafer 110 (i.e., "AR-1" coating layer). FIG. 4 further shows that there is no epoxy or anti-reflective (AR) coating at the bonding interface. Instead, a thin, IR transparent adhesion layer 150 is formed as the bonding interface layer in some embodiments. The thickness of the adhesion layer is, preferably 500 angstroms or less, is by way of example but the present disclosure is not limited thereto.

Figure 5:
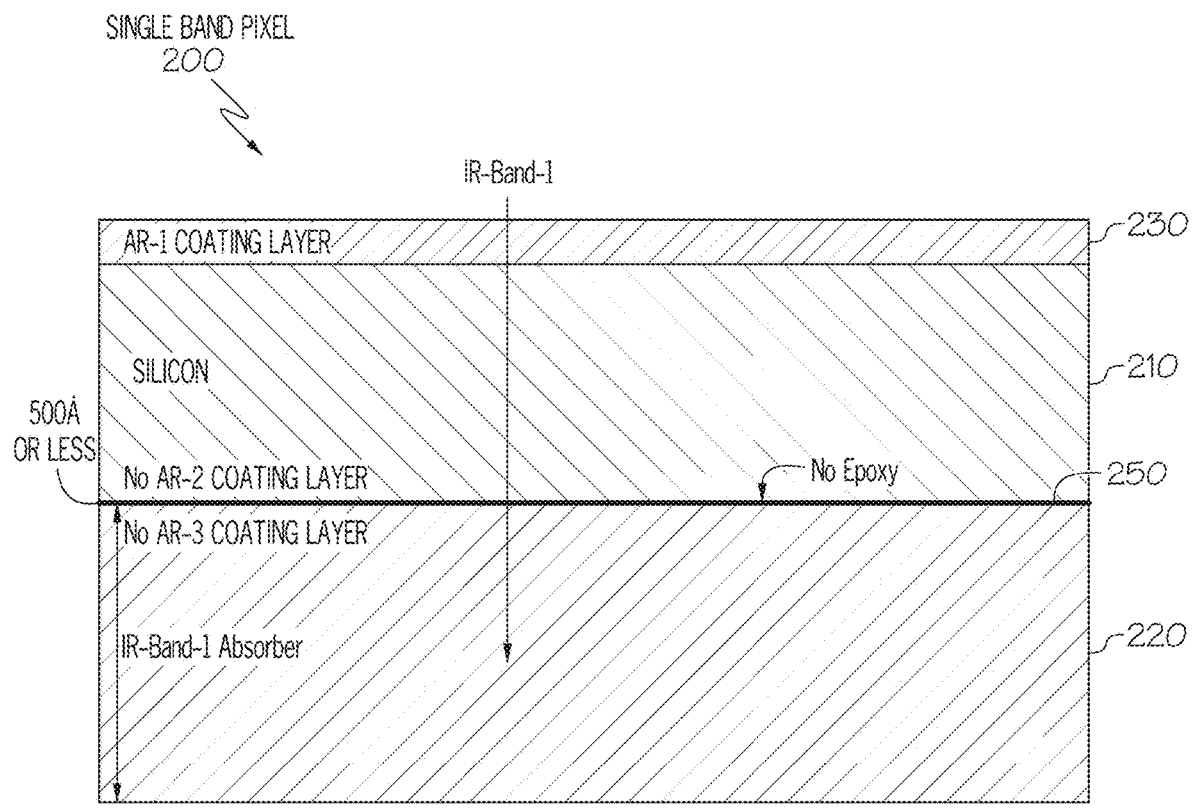
FIG. 5 depicts a cross sectional view of single-band IR detector materials bonded to a silicon wafer according to one or more embodiments described and illustrated herein.

FIG. 5 illustrates another embodiment of a single band SLS pixel 200 fabricated using the wafers direct bonding method according to the present disclosure. FIG. 5 illustrates a cross sectional view of a transparent silicon substrate 210 in contact with a SLS wafer 220 for a single band without using epoxy. As discussed above and shown in FIG. 4, the single band SLS pixel 200 eliminates epoxy and also removes the need for anti-reflective coating layers AR-2 and AR-3 coatings at the bonding interface between an infrared absorber layer 220 and the transparent silicon substrate 210 (shown in FIG. 2). Without epoxy, both the SLS wafer (corresponding to the IR detector materials 220) and the silicon wafer (corresponding to the silicon substrate 210) have high refractive indices which are closely matched. As shown in FIG. 5, there is a single infrared band including IR Band-1 absorber 220.

As described above, FIGS. 4-5 illustrate embodiments that use a thin silicon monoxide layer as the adhesion layers 150, 250 at the bonding interface. The silicon monoxide layer includes oxide component and oxidation of the silicon monoxide layer during heat-up causes or results in covalent bonding of bonding surfaces. Direct bonding may involve covalent chemical bonds that is formed between atoms on each side of the wafer interface, which may make it possible to bond the wafers together directly, without the use of epoxy. Due to the covalent chemical bonds, direct bonding may be similar to, or described as fusing the surfaces of the bonded wafers. Accordingly, the silicon monoxide layer may serve as an adhesion layer.

Alternatively, in other embodiments, suitable surface treatments can be performed to the bonding surfaces of the infrared detector wafer and the silicon wafer in order to cause or result in covalent bonding of the bonding surfaces. Such surface treatments may trigger covalent bonding like the oxidation effect of the silicon monoxide layer, and then the adhesion layer such as a silicon monoxide layer may be replaced by the surface treatment. In other words, direct bonding between the infrared detector wafer and the silicon wafer without any oxidation layer may be possible through the surface treatment triggering the oxidation effect.

Figure 6:
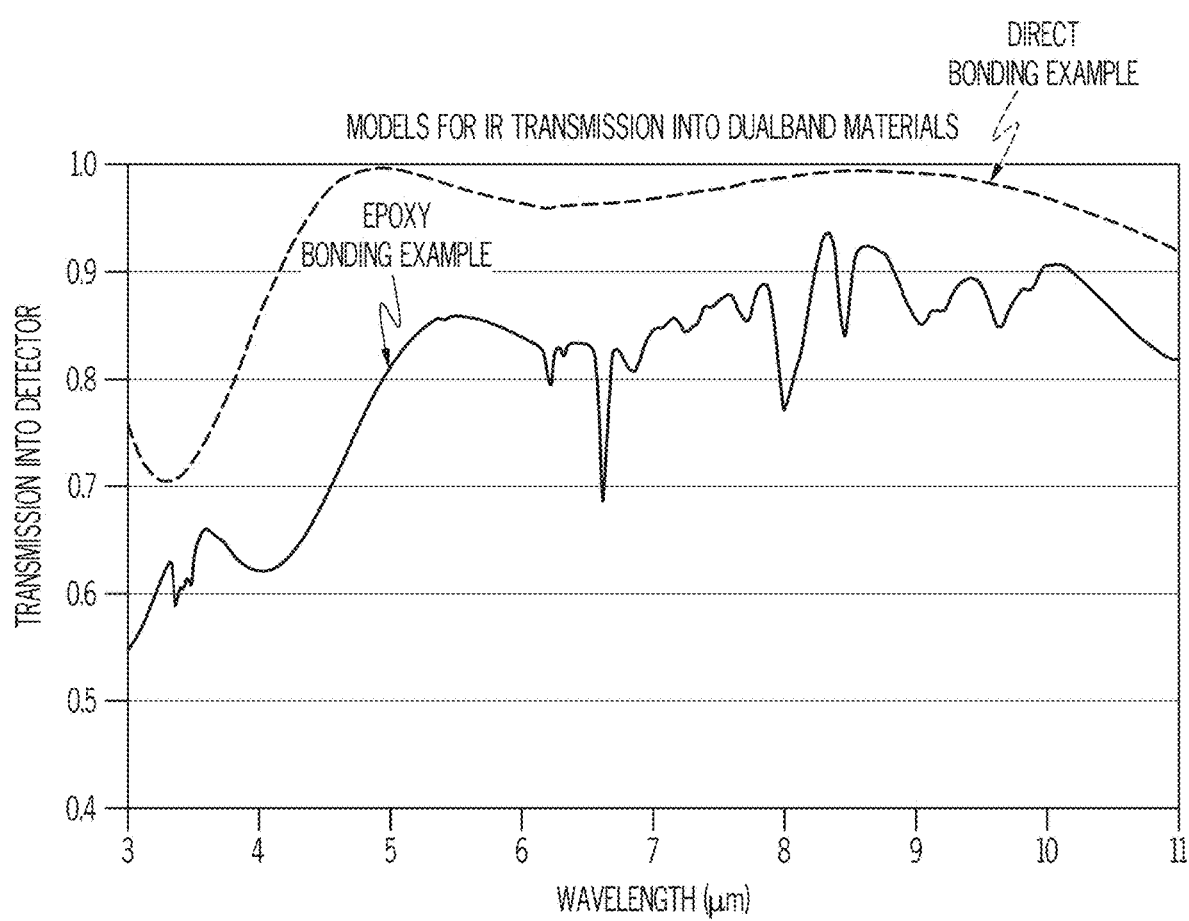
FIG. 6 depicts IR transmission characteristics of a direct bonding example with one AR coating design according to one or more embodiments described and illustrated herein and an epoxy bonding example with three AR coating design, respectively.

FIG. 6 depicts IR transmission characteristics of simulated FPA designs using the direct bonding process and an example with the epoxy bonding process. As discussed above, the simulated FPA designs includes one anti-reflective (AR) coating layer and the epoxy bonding example includes three AR coating layers. In addition, both simulated FPAs implement the dual-band pixel 100 (see FIG. 4) and the dual-band pixel 20 (see FIG. 2). The FPA designs implementing the dual-band pixel 100 do not use epoxy, and therefore, both the SLS wafer and the silicon wafer have high refractive indices, which are closely matched.

As shown in FIG. 6, elimination of thick, low refractive index epoxy layer may enable higher infrared transmission over larger bandwidths. For example, FIG. 6 shows more than 90% IR transmission into the IR detector in the range of 4~11 micron wavelength, as indicated with "Direct Bonding Example" using one anti-reflective coating layer design, as opposed to "Epoxy Bonding Example" using three anti-reflective coating layers design. In other words, Direct Bonding Example implements the dual-band pixel 100 as shown in FIG. 4, and Epoxy Bonding Example implements the dual-band pixel 20 as shown in FIG. 2.

Compared to the Epoxy Bonding Example, the Direct Bonding Example shows a more smooth curve throughout the relevant wavelength range. In particular, between 6 µm and 10 µm, the Epoxy Bonding Example shows transmission drops and irregular patterns. The IR transmission characteristics as shown in FIG. 6 is example only and characteristics can be customized based on needs.

In FIG. 6, the IR transmission characteristics represent unique properties of different infrared detector materials. The smooth curve of the Direct Bonding Example indicates a high degree of infrared radiation transmission and the irregular pattern of the Epoxy Bonding Example indicates interference to infrared transmission. Overall, the curves of the Direct Bonding Example and the Epoxy Bonding example show some degree of similarity, but the curve of the Direct Bonding Example shows much improved performance over the curve of the Epoxy Bonding Example.

Figure 7:
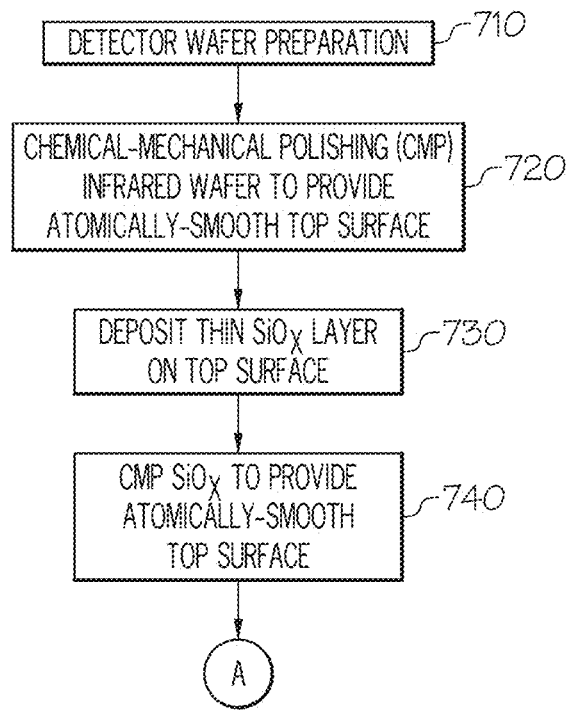
FIG. 7 is a flowchart of preparing an infrared detector wafer according to one or more embodiments described and illustrated herein.
Figure 8:
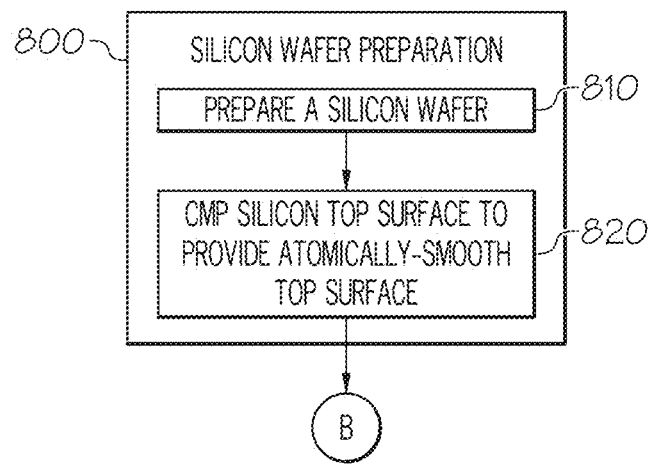
FIG. 8 is a flowchart of preparing a silicon wafer according to one or more embodiments described and illustrated herein.
Figure 9:
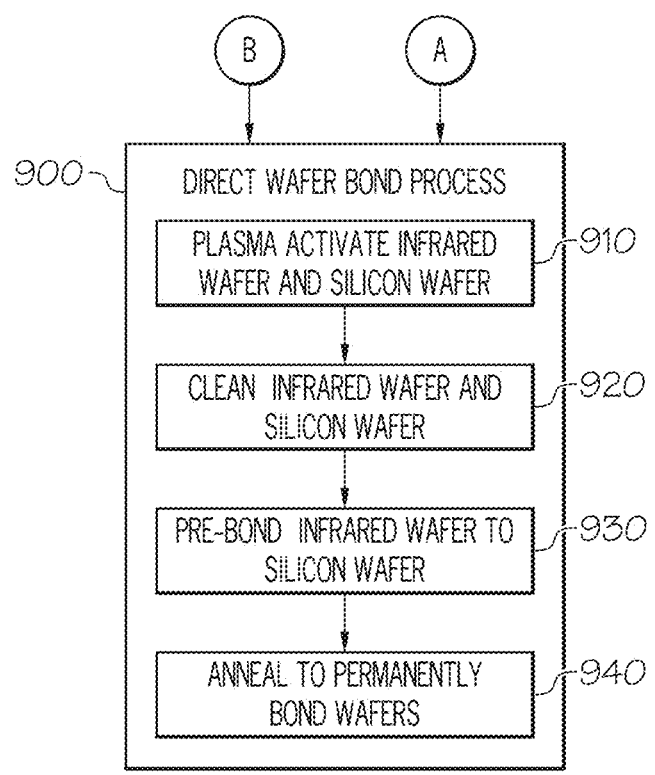
FIG. 9 is a flowchart of a direct wafer bonding process for bonding the infrared detector wafer as shown in FIG. 8 and the silicon wafer as shown in FIG. 9 according to one or more embodiments described and illustrated herein.

Referring to FIGS. 7 through 9, embodiments of a direct bonding process for bonding a silicon wafer to an infrared detector wafer are described. The direct bonding process involves three stages: a first stage for preparing the infrared detector wafer, a second stage for preparing the silicon wafer, and a third stage for directly bonding the infrared detector wafer and the silicon wafer. In some embodiments, the infrared detector wafer and the silicon wafer may be prepared based on needs and can be customized. In other embodiments, a flexible approach can be taken and a commercially available silicon wafer may be used to be directly bonded to the infrared detector wafer. When commercially available silicon wafers may be used, such silicon wafers also may subject to several steps required in the third stage of directly bonding to the infrared detector wafers.

FIG. 7 is a flowchart of preparing an infrared detector wafer. The infrared detector wafer that includes infrared detector materials is provided. In some embodiments, the infrared detector wafer may include a SLS wafer. Fabricating the infrared detector wafer is not within the scope of the embodiments and detailed explanations may be omitted. The infrared detector wafer may be prepared with a sacrificial capping layer, in the range of 1.0 to 2.0 microns thick, grown on top of the SLS wafer. More specifically, the sacrificial capping layer may grow on top of IR absorber materials, such as an absorber layer of the SLS wafer. For instance, the capping layer is formed of a wide band gap III-V material which is transparent to infrared radiation and having the wavelengths desired to be absorbed by the infrared detector.

At step 720, the top surface of the wafer is polished with the CMP process in order to provide the atomically smooth top surface. The CMP process may then remove the sacrificial capping layer, if present, by a small amount, without the loss of active IR material.

Once the top surface becomes polished, then a thin $SiO_x$ layer is deposited on the top surface (step 730). Chemical vapor deposition process may be used to deposit the thin $SiO_x$ layer on the top surface of the infrared detector wafer. For example, the silicon monoxide source material and the infrared detector wafer are loaded in a vacuum chamber. The temperature of the vacuum chamber increases and heats up the source material in order to deposit the silicon monoxide layer through thermal evaporation. While the thin $SiO_x$ layer is deposited, the thickness of the $SiO_x$ layer is adjusted to be thin, such as 1000 Angstroms or less.

At step 740, the deposited thin $SiO_x$ layer is polished to smoothen out the top surface to meet the level of atomic smoothness and ready for bonding. For instance, the $SiO_x$ surface roughness, like the SLS surface roughness, should also be 10 angstroms or less. This polishing process also simultaneously thins out the thickness of the $SiO_x$ layer. By way of example, the thickness may be adjusted down to 500 Angstroms or less. The deposited thin $SiO_x$ layer should have a minimum thickness in order to operate as an adhesion layer. In other words, the thin $SiO_x$ layer should not be completely removed. The prepared infrared detector wafer proceeds to a direct bonding stage following the arrow "A" in FIG. 7.

FIG. 8 is a flowchart 800 of preparing a silicon wafer. At step 810, a silicon wafer is provided. To prepare for direct bonding, the top surface of the silicon wafer is smoothened out to meet the level of atomically smoothness (step 820). In some cases, commercially available silicon wafers may be used and the silicon wafer preparation stage/process may be omitted. As discussed below, the silicon wafer, regardless of prepared on a customized basis, or commercially available, is polished with a CMP process prior to the direct bonding process (at 820). Moreover, the silicon wafer is subject to several subsequent steps required for the direct bonding to the infrared detector, as will be described below in connection with FIG. 9. The prepared silicon wafer proceeds to the direct bonding process as shown in the arrow "B."

FIG. 9 is a flowchart of a direct wafer bonding process 900 for bonding the infrared detector wafer prepared as shown in FIG. 7 and the silicon wafer prepared as shown in FIG. 8. At step 910, plasma surface activation is performed with respect to the infrared detector wafer and the silicon wafer prepared as described in FIGS. 7 and 8. Subsequently, the infrared detector wafer and the silicon wafer are cleaned (Step 920). As shown in FIG. 3B, defects on the bonding surfaces may result in void areas. Thus, the bonding surfaces should be cleaned and devoid of foreign substances. Once cleaned, wafers are brought together and pre-bonded via the thin $SiO_x$ formed on the infrared detector wafer (Step 930). As discussed above, covalent bonds may be formed between the smoothened surface of the silicon wafer and the smoothened surface of the $SiO_x$ layer on the infrared detector wafer. For instance, the polished, activated and cleaned surfaces of the silicon wafer and the infrared detector wafer may be in the chemically bonded state with covalent bonds, as if they are fused, when directly bonded together.

At step 940, thermal annealing at temperature, such as 150~175° C., is used to activate the wafer surfaces and form the covalent chemical bonds, producing a high-strength permanent wafer bond. Non-oxide atoms of the silicon wafer begin forming covalent bonds and chemically change silicon, thereby strengthening the pre-bond to permanent bond. Thus, having the silicon monoxide layer on the infrared detector wafer, in particular, the oxidation effect, may result in developing the direct bonding between the infrared detector wafer and the silicon wafer. The activated wafer surfaces may be referred to as fused, as such surfaces become bonded with the covalent chemical bonds. The direct bonding process described above shows excellent bonding results. There may be very few voids due to clean, polished interfaces, which leads to high device yield. No evidence of de-bonding has been observed throughout device fabrication processes subsequent to the direct bonding process.

Figure 10A:
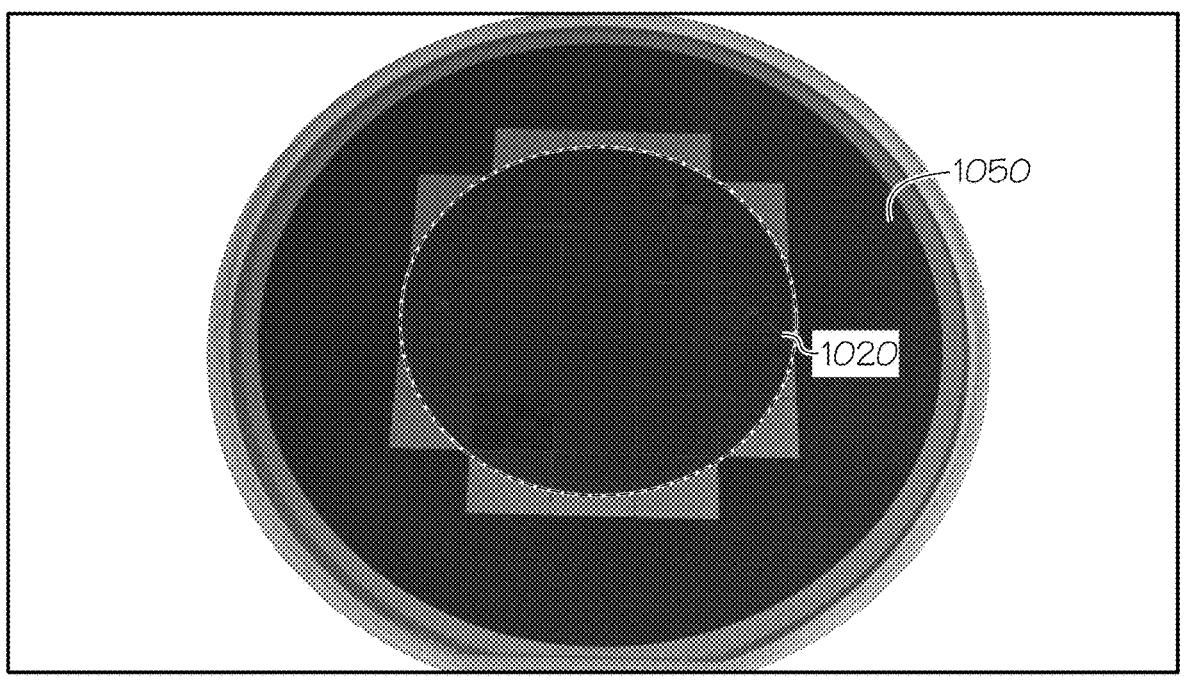
FIG. 10A depicts one embodiment of direct bonding of an infrared wafer to a silicon wafer according to one or more embodiments described and illustrated herein.
Figure 10B:
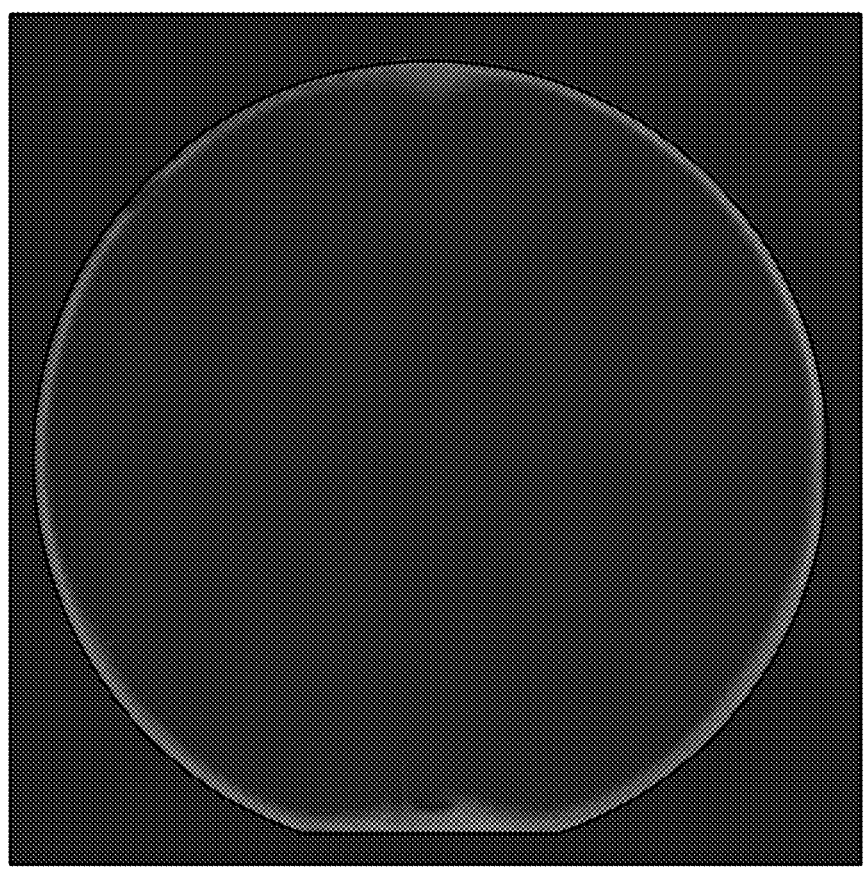
FIG. 10B depicts an acoustic image thereof exhibiting no void in the wafer bond interface area according to one or more embodiments described and illustrated herein.

FIGS. 10A and 10B depict one example of an SLS wafer directly bonded on a silicon wafer (FIG. 10A) and an acoustic image thereof (FIG. 10B). The example silicon wafer has 150 mm diameter and the example infrared wafer has 100 mm. FIG. 10A shows the infrared wafer that is formed and patterned after epitaxial growth materials are removed. In FIG. 10A, the infrared wafer primarily includes infrared radiation absorbing materials after patterning.

FIG. 10B shows the acoustic image of the bonding interface between the infrared wafer and the silicon wafer. The acoustic image is used to evaluate the bonding quality acoustically. The acoustic image may be obtained from ultrasonic imaging devices available in the art. In the acoustic image, voids appear as bright, circular spots as voids may result from air pocket. Acoustic waves travel well through solid material, but when acoustic waves encounter an air pocket, they may be reflected and appear as bright spots in the acoustic image. As shown in FIG. 10B, the acoustic image of the directly bonded infrared and silicon wafers shows a clear and uniform circular outline along the bonding area. The rest of the images appear as a dark and uniform images without any void. Overall, the acoustic image shown in FIG. 10B shows a good bonding along the entire bonding area.

As discussed above, plasma surface activation and thermal annealing are used to activate the wafer surfaces and form the covalent chemical bonds, producing a high-strength permanent wafer bond. The wafer bonding process described above shows excellent bonding results. There may be very few voids due to clean, polished interfaces, which leads to high device yield.

In principle, this optically transparent direct bonding method may include a variety of infrared detector materials, including InGaAs, InSb, SLS, QWIP, HgCdTe, and other common materials. The spectral transmission is limited only by the transmission of radiation through silicon, which is all wavelengths greater than 1.0 micron, up to 20.0 microns or more. Potentially the bonding interface also provides optical throughput covering wavelength below 1.0 um when a substrate alternative to silicon is used.

In the embodiments described above, a direct bonding method for infrared focal plane arrays, includes steps of depositing a thin adhesion layer on infrared radiation detecting material, removing a portion of the thin adhesion layer with a chemical-mechanical polishing process, forming a bonding layer at a bonding interface, and bonding the infrared radiation detecting material to a silicon wafer with the thin adhesion layer as the bonding layer.

In the embodiments described above, the step of depositing the thin adhesion layer further comprises depositing the thin adhesion layer such that a thickness of the thin IR transparent adhesion layer is 1000 angstroms or less. The step of removing the portion of the thin adhesion layer further comprises polishing the portion of the thin adhesion layer with a chemical-mechanical polishing process such that a thickness of the thin adhesion layer is 500 angstroms or less.

In the embodiments described above, the step of depositing the thin adhesion layer further comprises forming the thin adhesion layer from infrared transparent materials. The step of depositing the thin adhesion layer further comprises forming the thin adhesion layer with silicon monoxide material.

In the embodiments described above, the direct bonding method includes the step of forming the thin adhesion layer with $SiO_x$, where x is in the range of 1.0~2.0. In the direct bonding method, no epoxy layer is formed at the bonding interface. Additionally, the direct bonding method includes the step of forming no anti-reflective coating layer at the bonding interface.

In the embodiments described above, a direct bonding method for infrared detector wafers includes steps of polishing a first surface of an infrared detector wafer with a chemical-mechanical polishing (CMP) process to atomically smoothen the first surface, depositing a thin $SiO_x$ layer on the first surface, where x ranges 1.0 to 2.0, polishing a second surface of the thin $SiO_x$ layer to atomically smoothen the second surface, polishing a third surface of a silicon wafer with the CMP process to have a predetermined thickness, and directly bonding the second surface of the infrared detector wafer to the third surface the silicon wafer.

In the embodiments described above, the direct bonding method includes the step of depositing the thin $SiO_x$ layer to have a thickness of the thin IR transparent adhesion layer of 1000 angstroms or less. The step of polishing the second surface of the thin $SiO_x$ layer further comprises removing a portion of the thin $SiO_x$ layer to have a thickness of the thin IR transparent adhesion layer of 500 angstroms or less.

Additionally, the step of directly bonding further includes plasma activating the infrared detector wafer and the silicon wafer and cleaning the infrared detector wafer and the silicon wafer.

In the embodiments described above, the direct bonding method further comprising annealing the infrared detector wafer and the silicon wafer subsequent to direct bonding of the second and the third surfaces.

In the embodiments described above, a direct bonded wafers structure includes a silicon wafer having a first bonding surface, an infrared detector wafer comprising a thin adhesion layer and having a second bonding surface formed on top of the thin adhesion layer, and a bonding interface formed by directly bonding the first bonding surface and the second bonding surface. The thin adhesion layer includes a $SiO_x$ layer on the first surface, where x ranges 1.0 to 2.0. The thickness of the $SiO_x$ layer is 500 angstroms or less. The bonding interface includes no epoxy layer as an adhesive layer. The bonding interface includes no anti-reflective layer.

In the embodiments described above, the infrared detector wafer includes a dual-band pixel that includes a first infrared band absorbing layer and a second infrared band absorbing layer. In other embodiments, the infrared detector wafer includes a single-band pixel that includes a single infrared band absorbing layer.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein include wafer fusion bonding methods for infrared focal plane arrays. It should also be understood that these embodiments are merely exemplary and are not intended to limit the scope of this disclosure.

The invention claimed is:

1. A direct bonding method for frontside-illuminated infrared focal plane arrays, comprising:
   depositing a thin adhesion layer on infrared radiation detecting material such that a thickness of the thin adhesion layer is 1000 angstroms or less, wherein the thin adhesion layer is optically transparent;
   removing a portion of the thin adhesion layer with a chemical-mechanical polishing process;
   forming a bonding layer at a bonding interface; and
   bonding the infrared radiation detecting material to a silicon wafer with the thin adhesion layer as the bonding layer.

2. The method of claim 1, further comprising:
   providing an infrared wafer including the infrared radiation detecting material; and
   wherein bonding the infrared radiation detecting material further comprises directly bonding the infrared wafer to the silicon wafer via the thin adhesion layer such that the infrared wafer having a silicon substrate present on top thereof is provided.

3. The method of claim 1, wherein removing the portion of the thin adhesion layer further comprises polishing the portion of the thin adhesion layer with a chemical-mechanical polishing process such that a thickness of the thin adhesion layer is 500 angstroms or less.

4. The method of claim 1, wherein depositing the thin adhesion layer further comprises forming the thin adhesion layer from infrared transparent materials.

5. The method of claim 1, wherein depositing the thin adhesion layer further comprises forming the thin adhesion layer with a silicon monoxide material.

6. The method of claim 5, wherein forming the thin adhesion layer further comprises forming the thin adhesion layer with $SiO_x$, where x is in the range of 1.0~2.0.

7. The method of claim 1, wherein forming the bonding layer comprises forming no epoxy layer at the bonding interface.

8. The method of claim 7, wherein forming the bonding layer comprises forming no anti-reflective coating layer at the bonding interface.

9. A direct bonding method for infrared detector wafers, comprising:

polishing a first surface of an infrared detector wafer with a chemical-mechanical polishing (CMP) process;

depositing a $SiO_x$ layer on the first surface, where x ranges 1.0 to 2.0;

polishing a second surface of the $SiO_x$ layer to have a predetermined thickness;

polishing a third surface of a silicon wafer with the CMP process; and directly bonding the second surface of the infrared detector wafer to the third surface of the silicon wafer.

10. The method of claim 9, further comprising depositing the $SiO_x$ layer to have a thickness of the thin IR transparent adhesion layer of 1000 angstroms or less.

11. The method of claim 9, wherein polishing the second surface of the $SiO_x$ layer further comprises removing a portion of the $SiO_x$ layer to have a thickness of the thin IR transparent adhesion layer of 500 angstroms or less.

12. The method of claim 9, wherein the step of directly bonding further comprises:

plasma activating the infrared detector wafer and the silicon wafer; and cleaning the infrared detector wafer and the silicon wafer.

13. The method of claim 9, further comprising annealing the infrared detector wafer and the silicon wafer subsequent to direct bonding of the second and the third surfaces.

\* \* \* \* \*